(12) United States Patent
Herner (10) Patent No.: US 8,178,419 B2
(45) Date of Patent: *May 15, 2012

(54) METHOD TO TEXTURE A LAMINA SURFACE WITHIN A PHOTOVOLTAIC CELL

(75) Inventor: S. Brad Herner, San Jose, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 492 days.

This patent is subject to a terminal disclaimer.

(21) Appl. No.: 12/343,420

(22) Filed: Dec. 23, 2008

(65) Prior Publication Data

US 2010/0159629 A1    Jun. 24, 2010

Related U.S. Application Data (63) Continuation-in-part of application No. 12/026,530, filed on Feb. 5, 2008.

(51) Int. Cl.
*H01L 21/30* (2006.01)
(52) U.S. Cl. ............... 438/458; 438/96; 257/E21.412
(58) Field of Classification Search .............. 438/73–75, 438/96, 457–459; 257/E21.412
See application file for complete search history.

(56) References Cited

U.S. PATENT DOCUMENTS

| | | | |
|---|---|---|---|
| 4,240,842 | A | 12/1980 | Lindmayer |
| 6,146,979 | A | 11/2000 | Henley et al. |
| 7,858,430 | B2 * | 12/2010 | Hilali et al. ............... 438/72 |
| 2004/0206390 | A1 | 10/2004 | Bhattacharya |
| 2007/0235074 | A1 | 10/2007 | Henley et al. |
| 2007/0277874 | A1 | 12/2007 | Dawson-Elli et al. |
| 2008/0070340 | A1 | 3/2008 | Borrelli et al. |
| 2009/0142874 | A1 | 6/2009 | Arai |
| 2009/0194162 | A1 * | 8/2009 | Sivaram et al. ............... 136/258 |

OTHER PUBLICATIONS

Wang et al. "17.8% p-type Heterojunction Silicon Solar Cells by HWCVD". National Renewable Energy Laboratory, Golden, Colorado, USA.
Silicides for VLSI Applications by S.P. Murarka, Academic Press, New York, 1983.
T.P. Nolan, R. Sinclair, and R. Beyers, Modeling of agglomeration in polycrystalline thin films: Application to TiSi2 on a silicon substrate, J. Appl. Phys. 45, 720 (1992).
G.B. Kim, D.-J. Yoo, H.K. Baik, J.-M. Myoung, S.M. Lee, S.H. Oh, and C.G. Park, "Improved thermal stability of Ni silicide on Si (100) through reactive deposition of Ni," J. Vac. Sci. Tech. B 21, 319 (2003).
U.S. Appl. No. 12/026,530, filed Feb. 5, 2008, entitled "Method to Form a Photovoltaic Cell Comprising Thin Lamina".
U.S. Appl. No. 12/130,241, filed May 30, 2008, entitled "Asymmetric Surface Texturing for use in a Photovoltaic Cell and Method of Making".

(Continued)

*Primary Examiner* — Thanhha Pham
(74) *Attorney, Agent, or Firm* — The Mueller Law Office, P.C.

(57) ABSTRACT

It is advantageous to create texture at the surface of a photovoltaic cell to reduce reflection and increase travel length of light within the cell. A method is disclosed to create texture at the surface of a silicon body by reacting a silicide-forming metal at the surface, where the silicide-silicon interface is non-planar, then stripping the silicide, leaving behind a textured surface. Depending on the metal and the conditions of silicide formation, the resulting surface may be faceted. The peak-to-valley height of this texturing will generally be between about 300 and about 5000 angstroms, which is well-suited for use in photovoltaic cells comprising a thin silicon lamina.

6 Claims, 9 Drawing Sheets

OTHER PUBLICATIONS

U.S. Appl. No. 12/057,265, filed Mar. 27, 2008, entitled "Method to Form a Photovoltaic Cell Comprising a Thin Lamina Bonded to a Discrete Receiver Element".

U.S. Appl. No. 12/122,108, filed May 16, 2008, entitled "Ion Implanter for Photovoltaic Cell Fabrication".

U.S. Appl. No. 12/189,158, filed Aug. 10, 2008, entitled "Photovoltaic Cell Comprising a Thin Lamina Having a Rear Junction and Method of Making".

U.S. Appl. No. 12/339,032, filed Dec. 18, 2008, entitled Method for Making a Photovoltaic Cell Comprising Contact Regions Doped Through a Lamina.

Notice of Allowance dated Nov. 14, 2011 for U.S. Appl. No. 12/189,157.

Office Action dated Nov. 28, 2011 for U.S. Appl. No. 12/499,294.

* cited by examiner

Prior Art

Fig. 1

Prior Art

Fig. 2a

Prior Art

Fig. 2b

Embodiment of 12/026530

Fig. 3a

Embodiment of 12/026530

Fig. 3b

Embodiment of 12/026530

Fig. 3c

Embodiment of 12/026530

METHOD TO TEXTURE A LAMINA SURFACE WITHIN A PHOTOVOLTAIC CELL

BACKGROUND OF THE INVENTION

The invention relates to a method to form texture at a surface of a photovoltaic cell.

Light enters a photovoltaic cell and generates current. If any light passes entirely through the cell and escapes without being absorbed, cell efficiency is reduced. Thus methods are employed to increase travel distance of light within a photovoltaic cell, including reducing reflection at the front surface of the cell, reflecting light from the back surface of the cell, and bending light at either the front or back surface. One method to increase travel length of light in a photovoltaic cell is to create texture at the front and/or back surface.

In conventional monocrystalline silicon photovoltaic cells, it is well-known to texture surfaces using a crystallographic etch. One commonly used etch produces pyramids, with maximum peak-to-valley distances on the order of ten microns. Such surface texturing is effective for a wafer which is, for example, 150 microns thick or more. In a photovoltaic cell comprising a significantly thinner silicon lamina, however, this style of texturing may not be practical.

There is a need, therefore, for a method of surface texturing appropriate to a photovoltaic cell comprising a thinner semiconductor lamina.

SUMMARY OF THE PREFERRED EMBODIMENTS

The present invention is defined by the following claims, and nothing in this section should be taken as a limitation on those claims. In general, the invention is directed to texturing of a photovoltaic cell.

A first aspect of the invention provides for a method to create surface texture, the method comprising: forming a silicide by reacting deposited metal with silicon at a first surface of a silicon body; removing substantially all of the silicide from the first surface, leaving the first surface textured; and fabricating a photovoltaic cell comprising a silicon lamina, wherein the textured first surface is a surface of the silicon lamina.

Another aspect of the invention provides for a method to form a photovoltaic cell having surface texture, the method comprising: forming a silicide by consuming silicon at a first surface of a silicon body; removing substantially all of the silicide at the first surface, leaving the first surface textured; implanting gas ions into a silicon donor wafer to define a cleave plane; cleaving a lamina from the silicon donor wafer at the cleave plane; and fabricating the photovoltaic cell, wherein the photovoltaic cell comprises the lamina, and wherein the textured first surface is a surface of the lamina.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
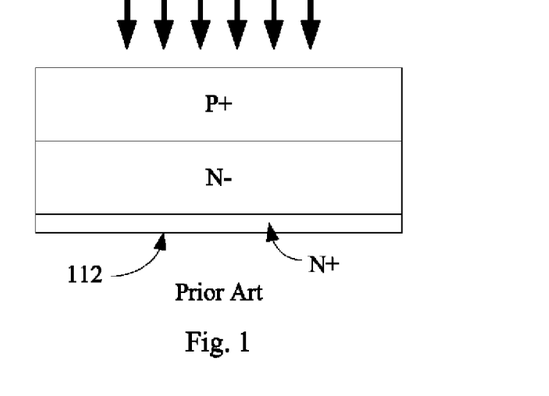
FIG. 1 is a cross-sectional view of a prior art photovoltaic cell.

A conventional prior art photovoltaic cell includes a p-n diode; an example is shown in FIG. 1. A depletion zone forms at the p-n junction, creating an electric field. Incident photons will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a n−/p+ junction (as shown in FIG. 1) or a p−/n+ junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
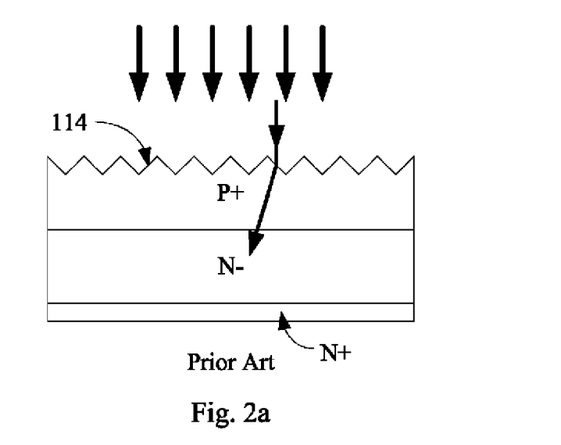
FIGS. 2a and 2b are cross-sectional views of prior art photovoltaic cells illustrating surface texturing.
Figure 2B:
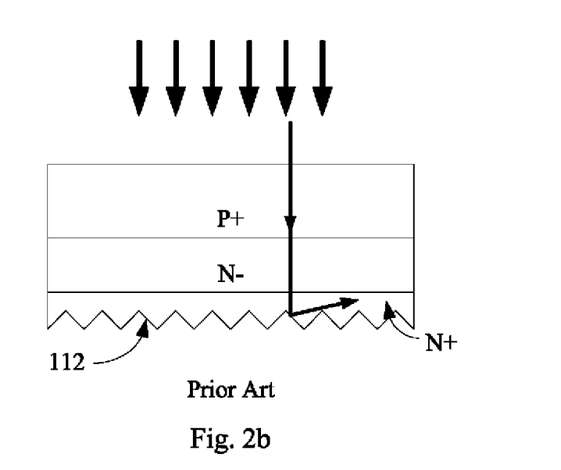

Some incident light may pass all the way through the cell without creating any electron-hole pairs, failing to generate any photocurrent and reducing the efficiency of the cell. Referring to FIG. 1, in which arrows indicate incident photons, to avoid allowing light to escape, typically a reflective surface is formed at the back surface 112 of the cell, so that light that passes through the cell is reflected back into the cell, where it may be absorbed. It is also well known to texture front surface 114 as in FIG. 2a, which will tend to reduce reflection from front surface 114 and cause incident light to be refracted, as shown. Back surface 112 may also be textured, as in FIG. 2b, changing the angle of light upon reflection. Either technique serves to increase travel length of light within the cell, improving cell efficiency, and in some cells both front and back surfaces are textured. Clearly both front and back surfaces may be textured. Ideally surface texturing will alter the path of light so that all light is internally reflected, and none escapes.

In conventional monocrystalline silicon photovoltaic cells fabricated from (100)-oriented silicon wafers, the most common way to create texture to bend and trap light is to perform a crystallographic etch such as a KOH etch on the wafer surface. This etch is selective, preferentially etching the (111) crystallographic planes. This results in a surface composed of microscopic pyramids, where the pyramid faces are (111) silicon crystallographic planes. The depth of this surface relief is typically on the order of ten microns. For photovoltaic cells formed from silicon wafers having a thickness of, for example, 150 microns or more, this texturing method is practical. For substantially thinner cells, however, lower-relief texturing is required.

Figure 3A:
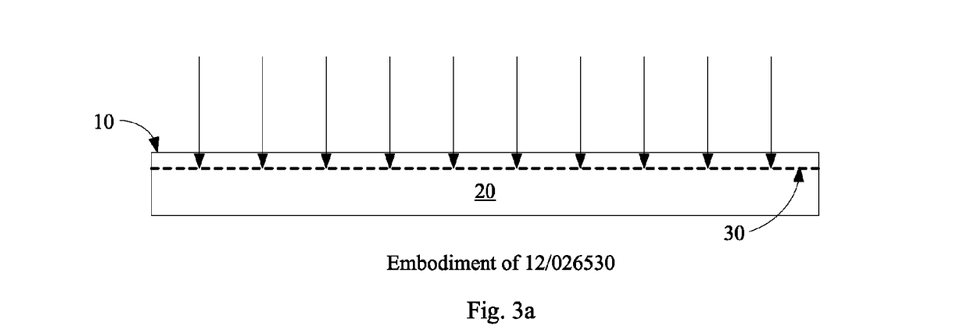
FIGS. 3a-3d are cross-sectional views showing stages in formation of an embodiment of Sivaram et al., U.S. patent application Ser. No. 12/026,530
Figure 3B:
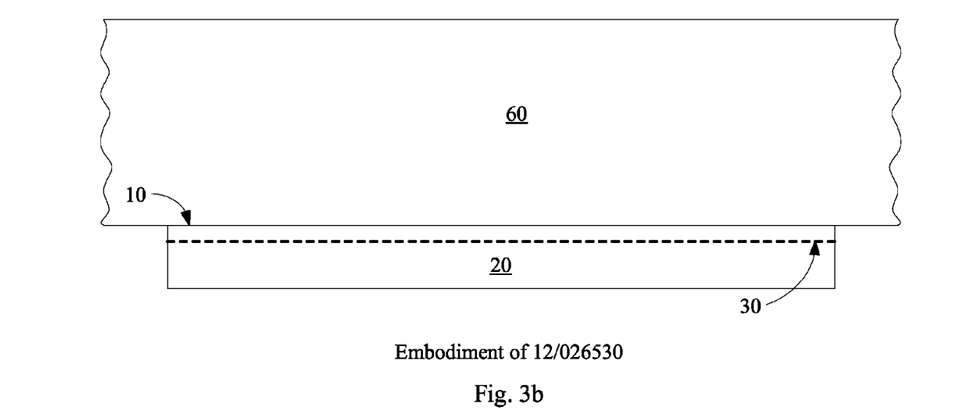
Figure 3C:
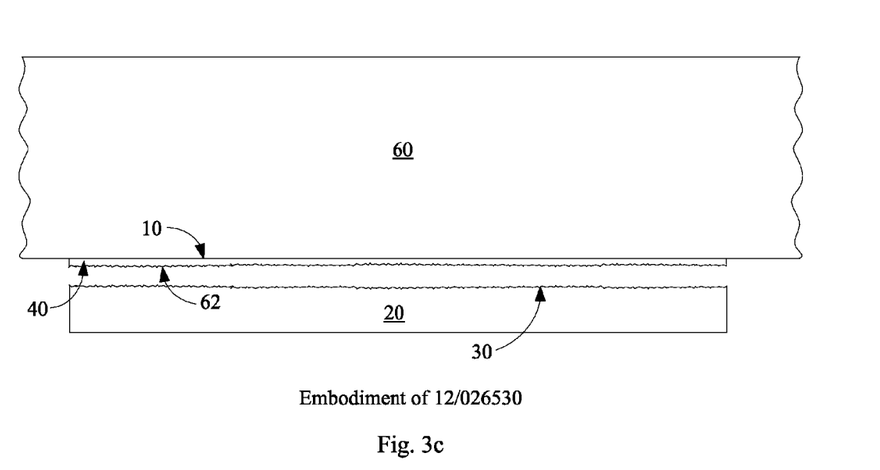
Figure 3D:
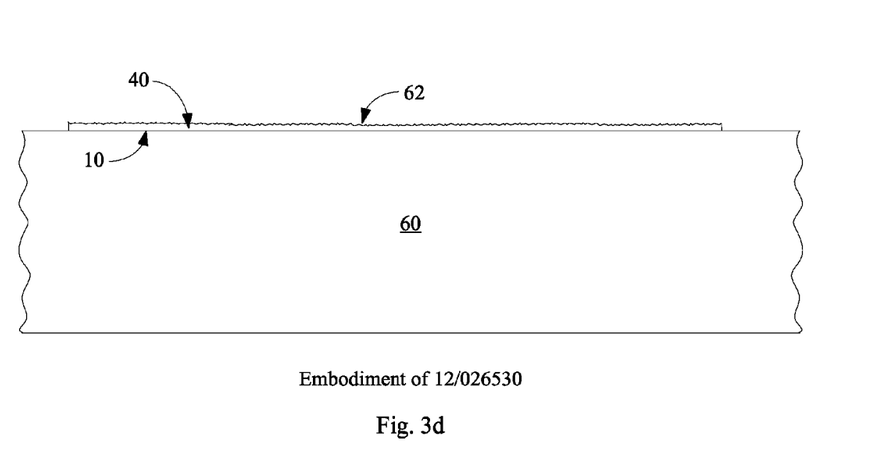

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 3a, in embodiments of Sivaram et al., a semiconductor donor wafer 20 is implanted with one or more species of gas ions, for example hydrogen and/or helium ions. The implanted ions define a cleave plane 30 within the semiconductor donor wafer. As shown in FIG. 3b, donor wafer 20 is affixed at first surface 10 to receiver 60. Referring to FIG. 3c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 3d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference.

Using the methods of Sivaram et al., photovoltaic cells are formed of thinner semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use. Because the lamina produced by Sivaram et al. is relatively thin, surface texturing to enhance bending and trapping of light may be particularly important.

In embodiments of Sivaram et al., the lamina is formed of monocrystalline silicon. The KOH etch conventionally used to create surface texture in photovoltaic cells formed of conventional (100)-oriented monocrystalline silicon wafers, which may be 150, 200, 250 or more microns thick, however, is an unlikely option for cells formed using the laminae formed by Sivaram et al. As mentioned earlier, the depth of surface relief formed by a KOH etch is typically on the order of ten microns, while in embodiments of Sivaram et al. the silicon lamina may be very thin, for example five microns thick or less.

In the present invention, a novel method is used to create surface texture at substantially smaller relief, for example having a peak-to-valley height between about 300 angstroms and about 5000 angstroms. Such a method can practically be used with a lamina having a thickness far less than the 150 or more microns of conventional cells fabricated from wafers.

Figure 4A:
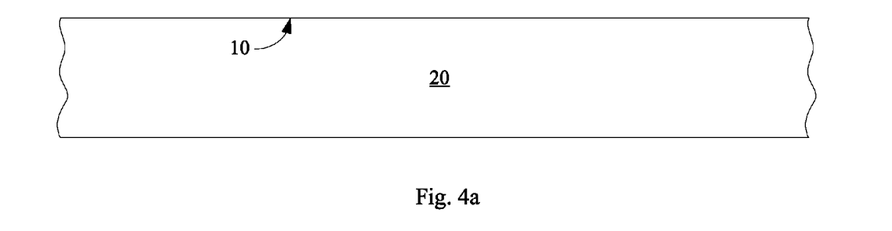
FIGS. 4a-4c are cross-sectional views illustrating formation of surface texture on a silicon body by formation and strip of a silicide according to an embodiment of the present invention.
Figure 4B:
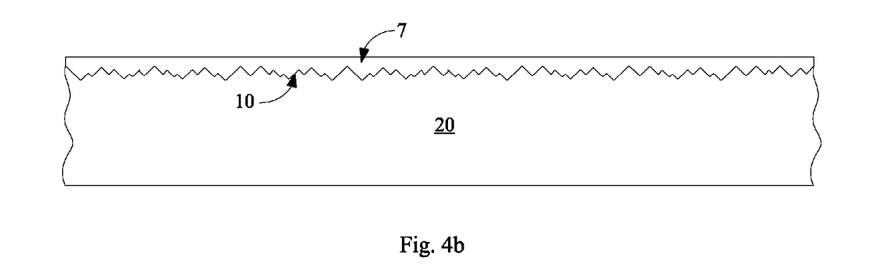

Turning to FIG. 4a, in aspects of the present invention a silicon body 20, such as a silicon wafer, begins with a surface 10, which may be substantially planar. As shown in FIG. 4b, a silicide-forming metal is formed on the silicon surface of a wafer 20, and is reacted with silicon to form a silicide layer 7. After silicide formation, the silicon-silicide interface will not be planar. Finally, turning to FIG. 4c, all of the silicide 7 is removed, leaving behind a non-planar, textured surface. The relief can be controlled by controlling the thickness, deposition conditions, and post-deposition thermal budget of the silicide-forming metal. Different metals behave differently during silicide formation, resulting in a variety of surface textures. Some silicides, for example nickel disilicide ($NiSi_2$), have an epitaxial relationship with the (111) plane of crystalline silicon. Due to this epitaxial relationship, during silicide formation the interface preferentially occurs at the (111) silicon plane. When the $NiSi_2$ is stripped, the resulting silicon surface exposes (111) planes, the same plane preferentially etched by a KOH etch.

Figure 4C:
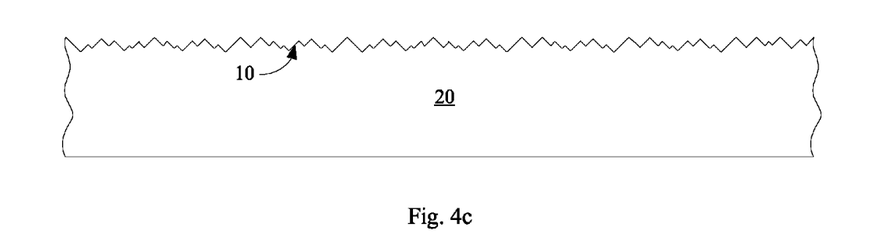

At some points, the film will likely take different forms; it may agglomerate, for example. Agglomeration will not leave behind facets following removal of silicide, but will alter the surface in other ways. Facets are desirable, but virtually any form of non-planarity will tend to reduce reflection and increase refraction, and thus increase travel length within the lamina, improving efficiency.

It is generally desirable to minimize the temperature during silicide formation, as it may enable the use of inexpensive but thermally unstable materials in the cell, such as aluminum wiring. Using lower temperature reduces cost, and, depending on the point at which silicide formation falls in the processing sequence, lower temperature may reduce or avoid damage to existing structures. Nickel disilicide can be formed by sputtering nickel onto silicon at a relatively low temperature, for example about 450 degrees. This or any other silicide-forming metal can either be sputtered at high temperature to react during sputtering, or, alternatively, may be sputtered at lower or room temperature, then annealed.

Other silicide-forming metals can be used instead of nickel, including titanium, tantalum, tungsten, palladium, platinum, cobalt, chromium, molybdenum, niobium, zirconium, and vanadium, or alloys thereof. These other silicides form a variety of textures which may be advantageous for reducing reflection and/or increasing refraction; for example $Pd_2Si$ tends to agglomerate in rodlike islands aligned to the crystal structure of silicon.

To summarize, surface texture is formed by forming a silicide by reacting deposited metal with silicon at a first surface of a silicon body; removing substantially all of the silicide from the first surface, leaving the first surface textured; and fabricating a photovoltaic cell comprising a silicon lamina, wherein the textured first surface is a surface of the silicon lamina.

Silicon is the semiconductor most commonly used to fabricate photovoltaic cells, but other semiconductor materials are sometimes used, including germanium or silicon-germanium. The methods of the present invention can be employed with other semiconductor materials as well; for example an appropriate metal may be reacted with germanium or silicon-germanium to produce a germanide or silicide-germanide instead.

For clarity, a detailed example of texturing at the surface of a lamina having thickness between 0.2 and 100 microns, where the lamina comprises, or is a portion of, a photovoltaic cell according to embodiments of the present invention, will be provided. For completeness, many materials, conditions, and steps will be described. It will be understood, however, that many of these details can be modified, augmented, or omitted while the results fall within the scope of the invention. In these embodiments, it is described to cleave a semiconductor lamina by implanting gas ions and exfoliating the lamina. Other methods of cleaving a lamina from a semiconductor wafer could also be employed in these embodiments.

EXAMPLE

Rear Local Contact

The process begins with a donor body of an appropriate semiconductor material. An appropriate donor body may be a monocrystalline silicon wafer of any practical thickness, for example from about 200 to about 1000 microns thick. In alternative embodiments, the wafer may be thicker; maximum thickness is limited only by practicalities of wafer handling. Alternatively, polycrystalline or multicrystalline silicon may be used, as may microcrystalline silicon, or wafers or ingots of other semiconductors materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline.

The process of forming monocrystalline silicon generally results in circular wafers, but the donor body can have other shapes as well. Cylindrical monocrystalline ingots are often machined to an octagonal cross section prior to cutting wafers. Multicrystalline wafers are often square. Square wafers have the advantage that, unlike circular or hexagonal wafers, they can be aligned edge-to-edge on a photovoltaic module with no unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 5A:
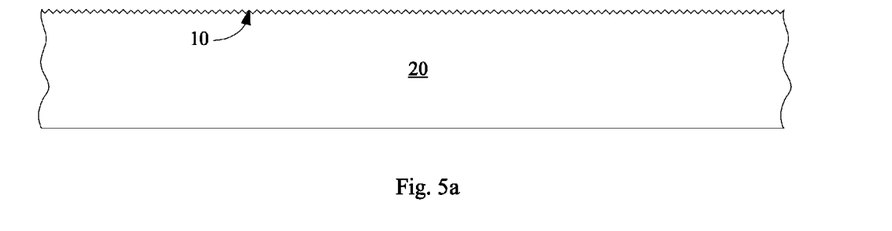
FIGS. 5a-5e are cross-sectional views showing stages in fabrication of a photovoltaic cell formed according to methods of the present invention.

If the silicide to be formed has an epitaxial relationship to the (111) plane of silicon, the formation of facets will be maximized by using a (100)-oriented monocrystalline silicon wafer. Referring to FIG. 5a, donor wafer 20 is a (100)-oriented monocrystalline silicon wafer which is lightly to moderately doped to a first conductivity type. The present example will describe a relatively lightly n-doped wafer 20 but it will be understood that in this and other embodiments the dopant types can be reversed.

When the process begins, first surface 10 of donor wafer 20 may be substantially planar, though in some embodiments there may be some preexisting texture at first surface 10. A silicide-forming metal, such as nickel, titanium, tantalum, tungsten, palladium, platinum, cobalt, chromium, molybdenum, niobium, zirconium, vanadium, or an alloy thereof, is deposited on first surface 10 of wafer 20. This example will describe use of nickel, which may be deposited by any appropriate method, such as sputtering. If this sputtering step is performed at elevated temperature, for example at least 400 degrees C., for example between about 400 and about 500 degrees C., the heat combined with sputtering energy will provide sufficient energy to form $NiSi_2$ during the sputtering process. The temperature during sputtering may be about 450 degrees C. The thickness of nickel deposited may be between about 25 and about 500 angstroms, for example between about 100 and about 200 angstroms. In some embodiments, about 100 to 150 angstroms of nickel may be deposited. It will be understood that this thickness of nickel is the thickness of a layer that would be produced if the silicide reaction were not taking place. About 100 angstroms of nickel produces the equivalent of about 365 angstroms of $NiSi_2$, though, due to the texture produced, the thickness of this layer will not be uniform. Typically other forms of nickel silicide, including $Ni_2Si$ and $NiSi$, may be formed along with $NiSi_2$.

In alternative embodiments, the silicide-forming metal may be deposited at lower temperature, such as room temperature, and an anneal may be performed later to induce the silicide reaction.

Next, all of the silicide is removed. This removal may be performed by any suitable method, for example an HF etch followed by a more aggressive metal clean to remove any metal contaminants from the surface. This metal clean may be, for example, a standard SC2 metal clean or an RCA2 clean, which is a combination of ammonium hydroxide ($NH_4OH$) and hydrogen peroxide ($H_2O_2$) diluted in water and heated. After the silicide is stripped, first surface 10 will be textured. If $NiSi_2$ or some other silicide having an epitaxial relationship with the (111) plane of silicon was formed, some portion of the texturing will include facets sloped at 54.7 degrees from horizontal. FIG. 5a shows the resulting surface texture. It will be understood that figures are not to scale, and texturing is shown exaggerated for visibility.

Figure 5B:
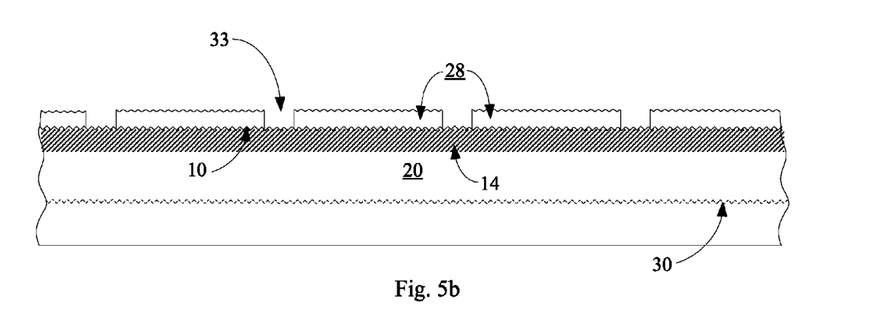

Turning to FIG. 5b, in the present example, heavily doped region 14 is formed by any suitable doping method, for example by diffusion doping. In the present example, heavily doped region 14 is p-doped, opposite the conductivity type of the body of wafer 20, creating a p-n junction. Doping may alternatively be performed by other methods, for example deposition and anneal of a doped oxide such as borosilicate glass. Next, a dielectric 28 is formed on first surface 10. As will be seen, in the present example, first surface 10 will be the back of the completed photovoltaic cell, and a reflective, conductive material is to be formed on the dielectric layer. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited. A grown oxide or nitride layer 28 passivates first surface 10 better than if this layer is deposited. In some embodiments, a first thickness of layer 28 may be grown, while the rest is deposited. As shown, the texture at first surface 10 is translated to the surface of layer 28.

In the next step, ions, preferably hydrogen or a combination of hydrogen and helium, are implanted through dielectric layer 28 into wafer 20 to define a cleave plane 30, as described earlier. The cost of this hydrogen or helium implant may be kept low by methods described in Parrill et al., U.S. patent application Ser. No. 12/122,108, "Ion Implanter for Photovoltaic Cell Fabrication," filed May 16, 2008, owned by the assignee of the present invention and hereby incorporated by reference. This implant is conformal, so any texture at the point of entry of the implanted ions at the surface of layer 28 is reproduced in cleave plane 30. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 microns.

After implant, openings 33 are formed in dielectric 28 by any appropriate method, for example by laser scribing or screen printing. The size of openings 33 may be as desired, and will vary with dopant concentration, metal used for contacts, etc. In one embodiment, these openings may be about 40 microns square.

Figure 5C:
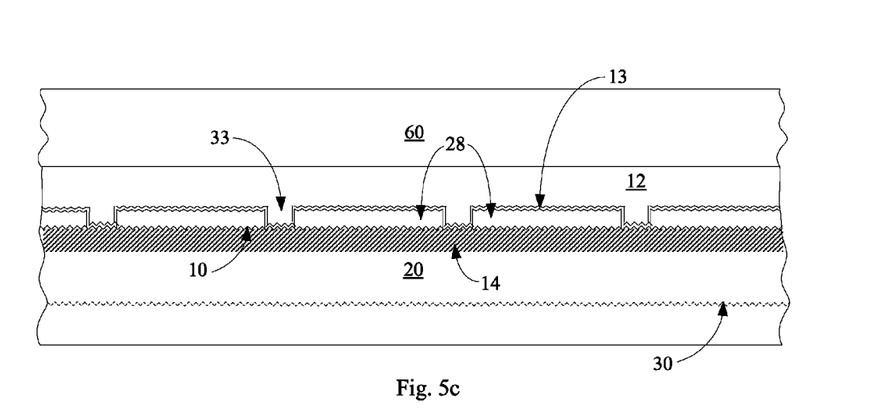

Turning to FIG. 5c, a layer 13 of a conductive barrier material is deposited next on dielectric layer 28, filling openings 33 and contacting heavily doped region 14 at first surface 10. Possible materials for this layer include tantalum, titanium, titanium nitride, or a stack of appropriate materials, for example titanium and titanium nitride. Barrier layer 13 may be, for example, about 1000 angstroms thick or more. Next a layer 12 of a conductive material is formed, for example aluminum, silver, copper, titanium, chromium, molybdenum, tantalum, zirconium, vanadium, indium, cobalt, antimony, or tungsten, or alloys thereof. Conductive layer 12 may be a stack of conductive materials. In one embodiment, conductive layer 12 is a thick layer, for example about three microns, of aluminum. Barrier layer 13 serves to prevent reaction between conductive layer 12 and silicon, which may contaminate the lamina to be formed and compromise cell efficiency. In some embodiments, barrier layer 13 may be omitted.

Next, wafer 20 is affixed to a receiver element 60, with dielectric layer 28, conductive barrier layer 13, and conductive layer 12 intervening. Receiver element 60 may be any suitable material, including glass, such as soda-lime glass or Pyrex; a metal or metal alloy such as stainless steel or aluminum; a polymer; or a semiconductor, such as metallurgical grade silicon. The wafer 20, receiver element 60, and intervening layers are bonded by any suitable method. If receiver element 60 is soda-lime glass, anodic bonding may be advantageous. In most embodiments, receiver element 60 has a widest dimension no more than about twenty percent greater than the widest dimension of wafer 20, and in most embodiments the widest dimension may be about the same as that of wafer 20.

Figure 5D:
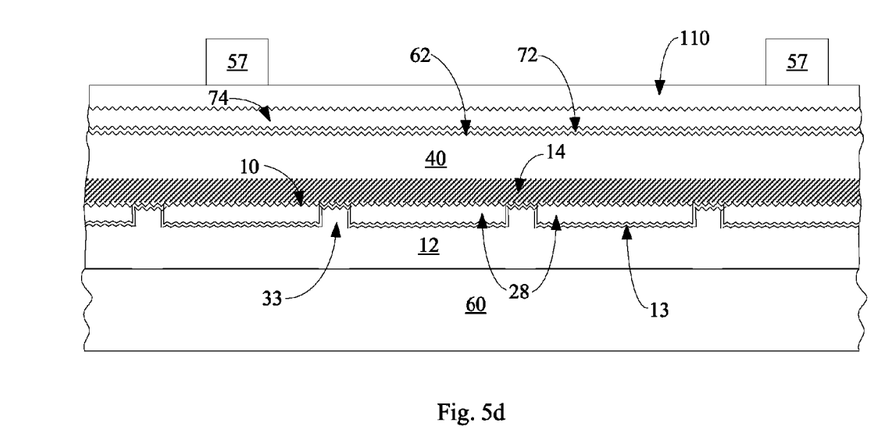

Referring to FIG. 5d, which shows the structure inverted with receiver element 60 on the bottom, a thermal step causes lamina 40 to cleave from donor wafer 20 at the cleave plane. In some embodiments, this cleaving step may be combined with a bonding step. Cleaving is achieved in this example by exfoliation, which may be achieved at temperatures between, for example, about 350 and about 650 degrees C. In general exfoliation proceeds more rapidly at higher temperature. Exfoliation temperatures below 600 degrees C., for example between about 450 and 550 degrees C., may reduce unwanted dopant diffusion. The thickness of lamina 40 is determined by the depth of cleave plane 30. In many embodiments, the thickness of lamina 40 is between about 1 and about 10 microns, for example between about 2 and about 5 microns.

Second surface 62 has been created by exfoliation. As shown, the texture created at first surface 10 has been translated to second surface 62. In some embodiments, this texture will be sufficient for the completed cell. In other embodiments, an additional texturing step may be performed at second surface 62.

Note also that following exfoliation of lamina 40, the surface of donor wafer 20 left behind by exfoliation (not shown) also follows the contours of cleave plane 30. Thus if additional laminae are to be exfoliated from donor wafer 20, the surface of wafer 20 is already textured before the next implant step begins. This texturing will be passed along during multiple exfoliations.

After cleaning, a thin layer 72 of intrinsic amorphous silicon is deposited on second surface 62. Layer 72 may be, for example, about 50 angstroms thick. In some embodiments intrinsic amorphous layer 72 may be omitted. A layer 74 of heavily doped amorphous silicon is formed on layer 72, and may be, for example, about 300 angstroms thick. In general, the combined thickness of layers 72 and 74 will be between about 200 and about 500 angstroms, for example about 350 angstroms. Both amorphous silicon layers 72 and 74 are formed by any convention method, for example plasma enhanced chemical vapor deposition (PECVD). Amorphous silicon deposited by PECVD is conformal, so the texturing of second surface 62 is transferred through amorphous layers 72 and 74 so that the surface of layer 74 is textured. In this example, heavily doped amorphous layer 74 is doped n-type, the same conductivity type as lightly doped lamina 40. Amorphous layer 74 provides an electrical contact to the photovoltaic cell being formed. This PECVD step can be performed at relatively low temperature, allowing some low-cost materials which cannot tolerate high temperatures, such as soda-lime glass, to be used as receiver element 60. Keeping temperature low further facilitates the use of aluminum in conductive layer 12. Aluminum has a relatively low melting point and will flow and deform with exposure to excessive temperature.

In this embodiment, recall that heavily doped region 14, formed at first surface 10, was doped with a p-type dopant, opposite the conductivity type of the n-doped body of lamina 40, forming a p-n junction, such that region 14 behaves as the emitter of the cell, while amorphous layer 74 is doped to the same conductivity type, providing electrical contact to the cell. In an alternative embodiment, heavily doped region 14 can be doped to the same conductivity type as the body of lamina 40, while heavily doped amorphous layer 74 is doped to the opposite conductivity type. In this case, heavily doped region 14 provides electrical contact to the cell, while heavily doped amorphous layer 74 serves as the emitter. In both embodiments, the lightly doped body of lamina 40 serves as the base of the cell. In all embodiments described, the conductivity types can be reversed.

A transparent conductive oxide (TCO) layer 110 is formed on heavily doped amorphous layer 74. Appropriate materials for TCO 110 include aluminum-doped zinc oxide, as well as indium tin oxide, tin oxide, titanium oxide, etc.; this layer may serve as both a top electrode and an antireflective layer. In alternative embodiments, an additional antireflective layer (not shown) may be formed on top of TCO 110. Finally, in some embodiments wiring 57 is formed on TCO 110 by any suitable method. Wiring 57 may be formed of, for example, aluminum screen print paste and fired at low temperature.

Figure 5E:
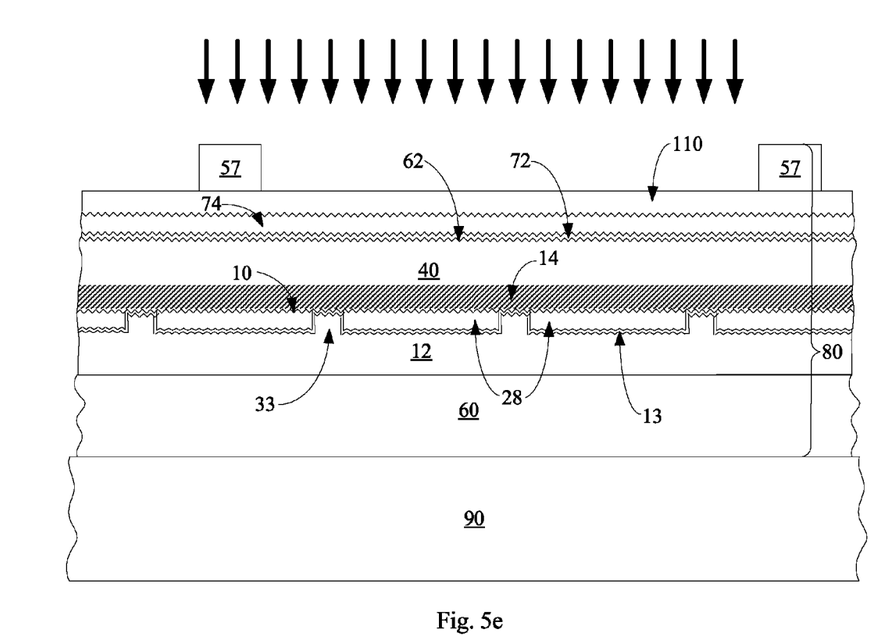

FIG. 5e shows completed photovoltaic assembly 80 which includes lamina 40 and receiver element 60, and includes a completed photovoltaic cell. Photovoltaic assembly 80, along with a plurality of other photovoltaic assemblies 80, can be mounted on substrate 90, as shown, forming a photovoltaic module. In an alternative embodiment, photovoltaic assemblies 80 can be affixed to a transparent superstrate, not shown. Incident light, as indicated by arrows, enters lamina 40 at second surface 62, and, after traveling through lamina 40, is reflected back into lamina 40 at first surface 10. The photovoltaic cells of the photovoltaic assemblies 80 can be connected electrically in series, for example using the methods described in Petti et al., "Front Connected Photovoltaic Assembly," U.S. patent application Ser. No. 12/331,376, filed Dec. 9, 2008, owned by the assignee of the present application and hereby incorporated by reference.

Figure 6A:
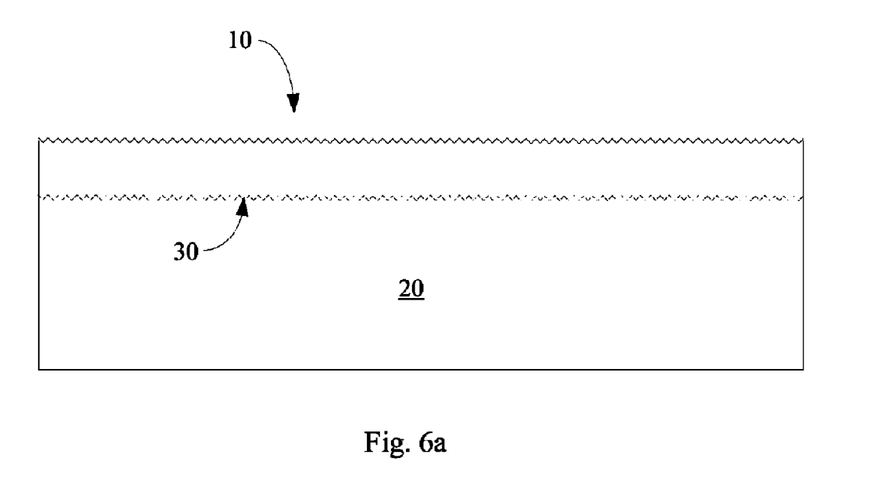
FIGS. 6a and 6b are cross-sectional views illustrating implant following texturing, according to an embodiment of the present invention.
Figure 6B:
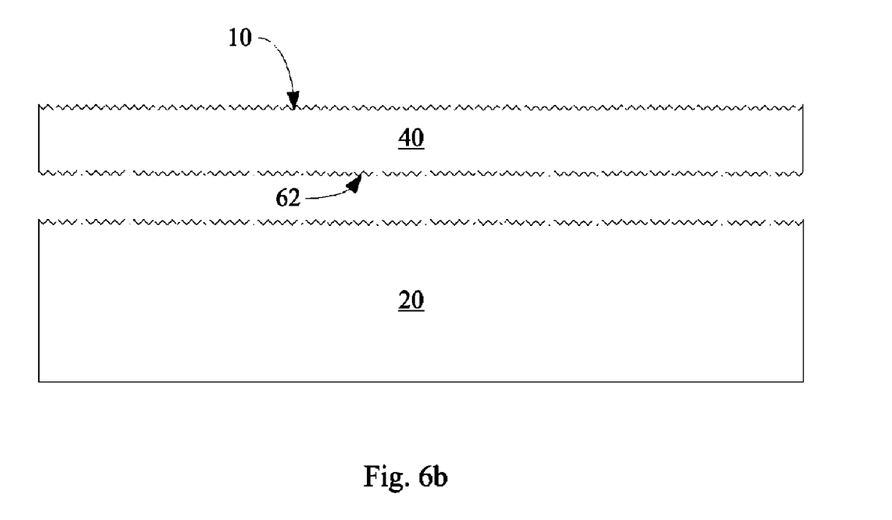
Figure 7A:
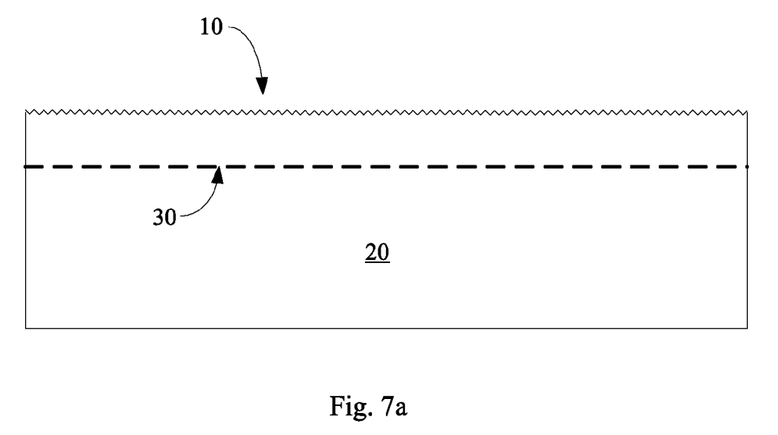
FIGS. 7a and 7b are cross-sectional views illustrating implant before texturing, according to another embodiment of the present invention.
Figure 7B:
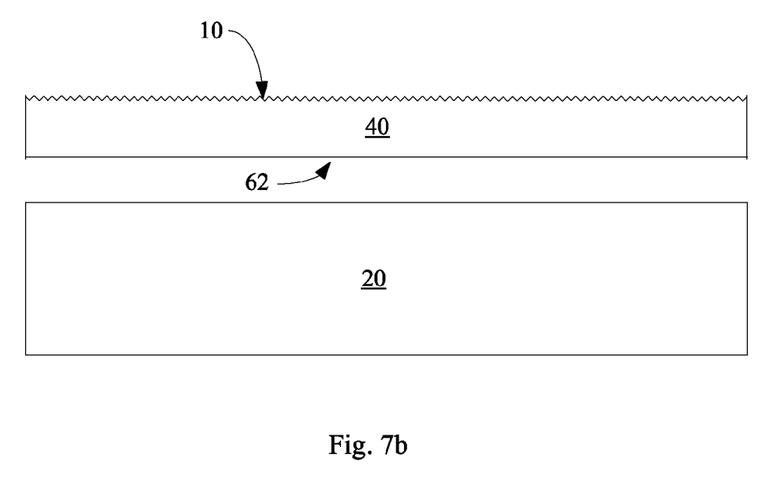
Figure 8:
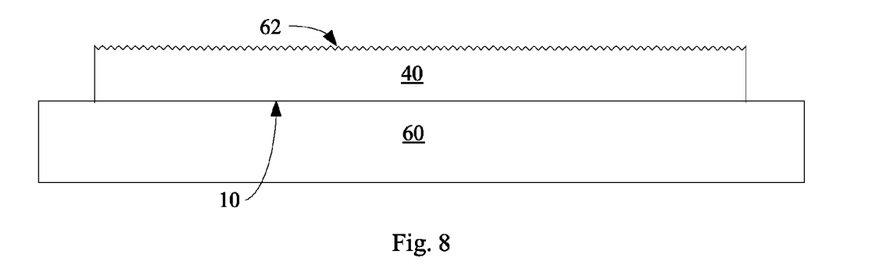
FIG. 8 is a cross-sectional view illustrating texturing following exfoliation according to yet another embodiment of the present invention.

For clarity and completeness, a detailed example has been provided, but many alternatives exist. Referring to FIG. 6a, in the example given, the first surface 10 of wafer 20 was textured before implant to form cleave plane 30, such that cleave plane 30 reflected the texture already formed at first surface 10, and, referring to FIG. 6b, second surface 62, created by exfoliation, was textured as soon as the exfoliation step was completed, creating lamina 40. As shown in FIG. 7a, in other embodiments, the implant step may be performed before first surface 10 is textured, so that cleave plane 30 has no significant texture. In this case, as shown in FIG. 7b, second surface 62 will not be formed with the silicide-induced texture of first surface 10 already present upon exfoliation. If desired, a second silicide step may be performed to form texture at second surface 62, using the same or a different silicon-forming metal. Turning to FIG. 8, in some embodiments, texture may be produced by silicide only at second surface 62, the surface created by exfoliation, and not at first surface 10, which is shown affixed to receiver element 60, with receiver element 60 shown on the bottom. In this case, clearly the silicide formation step will take place following exfoliation.

Summarizing, texture may be created by forming a silicide by consuming silicon at a first surface of a silicon body; removing substantially all of the silicide at the first surface, leaving the first surface textured; implanting gas ions into a silicon donor wafer to define a cleave plane; cleaving a lamina from the silicon donor wafer at the cleave plane; and fabricating the photovoltaic cell, wherein the photovoltaic cell comprises the lamina, and wherein the textured first surface is a surface of the lamina. Referring to, for example, FIG. 6a, the silicon body may be the silicon wafer, and texturing may take place at first surface 10 before the cleaving of the lamina, or, referring to FIG. 8, the silicon body may be the lamina, and texturing may take place at second surface 62 after the cleaving of the lamina.

Figure 9:
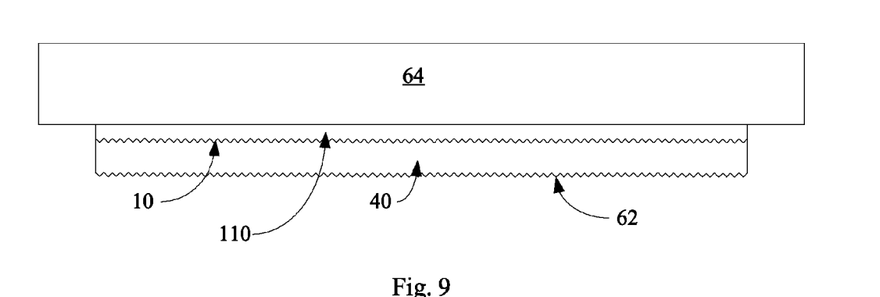
FIG. 9 is a cross-sectional view illustrating another embodiment, in which incident light enters the lamina at a surface textured by methods of the present invention.

Referring to FIG. 5e, in the example given, incident light enters lamina 40 at second surface 62. Referring to FIG. 9, in other embodiments, first surface 10 may be textured using methods of the present invention. The donor wafer is affixed to receiver element 64, which is transparent, with TCO 110 between them. Additional processing steps, including doping, are performed to complete a photovoltaic cell. In this example, receiver element 64 serves as a superstrate in the completed photovoltaic cell, and incident light enters the cell at first surface 10. An additional texturing step according to the methods disclosed herein may be performed at second surface 62 following its creation by exfoliation. More detailed examples of fabrication of a photovoltaic cell in which the receiver element serves as a superstrate are provided in Sivaram et al. and Herner, earlier incorporated.

The methods of the present invention may be used to create texture at the surface of any photovoltaic cell. The small relief of this texture makes it particularly useful in any photovoltaic cell having a semiconductor body which is thin, for example 100 microns thick or less. Specifically, surface texture may be produced by first forming, then removing, a silicide in any of the embodiments described in Sivaram et al. or Herner, earlier incorporated, or in Halali et al., "Photovoltaic Cell Comprising a Thin Lamina Having a Rear Junction and Method of Making," U.S. patent application Ser. No. 12/189,158, filed Aug. 10, 2008; or in Hilali et al., "Photovoltaic Cell Comprising Contact Regions Doped Through a Lamina," U.S. patent application Ser. No. 12/339,038, filed Dec. 18, 2008, both owned by the assignee of the present application and hereby incorporated by reference.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to form a photovoltaic assembly, the method comprising:
    doping a first surface of a semiconductor donor body by diffusion doping to a first conductivity type to form a doped first surface;
    defining a cleave plane in the semiconductor donor body;
    affixing the doped first surface to a receiver element;
    cleaving a lamina from the semiconductor donor body at the cleave plane, wherein the lamina remains affixed to the receiver element, wherein a second surface of the lamina is created by the cleaving step;
    depositing amorphous silicon directly on the second surface, wherein at least a part of the amorphous silicon is heavily doped; and
    fabricating a photovoltaic cell with an emitter and a base, wherein the heavily doped amorphous silicon comprises the emitter of the photovoltaic cell, and the lamina comprises the base of the photovoltaic cell.

2. The method of claim 1 wherein in the completed photovoltaic cell, a conductive material is disposed between the lamina and the receiver element.

3. The method of claim 2 wherein, in the completed photovolta cell, a dielectric layer is disposed between the conductive material and the receiver element.

4. The method of claim 1 wherein the heavily doped amorphous silicon is doped to a second conductivity type opposite the first conductivity type.

5. The method of claim 2, wherein the conductive material is cobalt.

6. The method of claim 1 wherein at least a part of the amorphous silicon is intrinsic amorphous silicon.

* * * * *